United States Patent
Kim et al.

(10) Patent No.: US 7,348,219 B2
(45) Date of Patent: Mar. 25, 2008

(54) METHOD OF MOUNTING MEMORY DEVICE ON PCB FOR MEMORY MODULE

(75) Inventors: Do-Hyung Kim, Seoul (KR); Chang-Woo Koo, Seoul (KR); Jung-Joon Lee, Seoul (KR); Ki-Hyun Ko, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 11/301,142

(22) Filed: Dec. 12, 2005

(65) Prior Publication Data

US 2006/0125071 A1    Jun. 15, 2006

(30) Foreign Application Priority Data

Dec. 10, 2004    (KR) .................. 10-2004-0103954

(51) Int. Cl.
*H01L 21/50* (2006.01)
*H05K 7/00* (2006.01)

(52) U.S. Cl. ............... 438/125; 257/E21.499; 361/760; 361/777

(58) Field of Classification Search ........ 438/106, 438/125; 257/E21.499, E21.511
See application file for complete search history.

(56) References Cited

U.S. PATENT DOCUMENTS

| | | | |
|---|---|---|---|
| 4,171,855 A * | 10/1979 | Raskin | 439/70 |
| 5,235,472 A * | 8/1993 | Smith | 360/60 |
| 5,357,624 A * | 10/1994 | Lavan | 711/115 |
| 5,410,182 A | 4/1995 | Kurafuchi et al. | 257/692 |
| 5,953,216 A * | 9/1999 | Farnworth et al. | 361/777 |
| 6,324,436 B1 * | 11/2001 | Moresco | 700/36 |
| 6,751,113 B2 * | 6/2004 | Bhakta et al. | 365/63 |
| 6,850,414 B2 * | 2/2005 | Benisek et al. | 361/748 |
| 6,873,534 B2 * | 3/2005 | Bhakta et al. | 365/63 |
| 2002/0022303 A1 * | 2/2002 | Senba et al. | 438/122 |
| 2002/0196612 A1 * | 12/2002 | Gall et al. | 361/760 |
| 2005/0018495 A1 * | 1/2005 | Bhakta et al. | 365/199 |
| 2005/0022396 A1 * | 2/2005 | Sano | 33/1 PT |
| 2005/0136740 A1 * | 6/2005 | Ludwig | 439/610 |

* cited by examiner

*Primary Examiner*—Scott B. Geyer
(74) *Attorney, Agent, or Firm*—Mills & Onello LLP

(57) ABSTRACT

A memory module and a method of mounting memory devices on a PCB to form the memory module substantially reduce unnecessary routing space and improve signal attenuation characteristics. In the method of mounting and sequentially connecting at least two memory devices on a printed circuit board (PCB) having an axis of elongation to form a memory module, at least one of the memory devices is mounted on at least one face of the PCB so that a base line along an longitudinal axis of the at least one memory device lies at an acute angle with respect to the axis of elongation of the PCB.

21 Claims, 5 Drawing Sheets

METHOD OF MOUNTING MEMORY DEVICE ON PCB FOR MEMORY MODULE

CROSS REFERENCE TO RELATED APPLICATIONS

This application claims priority under 35 U.S.C. §119 to Korean Patent Application 2004-103954, filed on Dec. 10, 2004, the contents of which are hereby incorporated by reference in their entirety for all purposes as if fully set forth herein.

BACKGROUND OF THE INVENTION

1. Technical Field

The present invention relates to a semiconductor memory, and more particularly, to a memory module and method of mounting a memory device on a printed circuit board (PCB) to form the memory module, which is capable of substantially reducing unnecessary routing space.

2. Description of the Background

Modern computer systems require rapid operating speed and high frequency operation. Computer systems commonly employ memory devices such as DRAMs (Dynamic Random Access Memory devices) as a main system memory. Such DRAM devices have developed into synchronous DRAM (SRAM) devices, double data rate SDRAM devices, and Rambus DRAM (hereinafter, referred to as 'RDD') devices, to obtain high performance operation that is required for a computer system.

In an RDD, a plurality of RDDs are arranged in a series array on a bus line of a memory system such as a Rambus system. Operation of respective RDDs is controlled by a packet signal of which signals are sequentially received during a predefined signal section. The respective RDDs input and output data respectively and independently. Currently a RiMM (Rambus inline memory module) that is used as a module of computer system is constructed of RDDs. In the RDDs, consecutive data is provided sequentially from a single data pin, and transmission rate, or bandwidth, is determined by the speed of the consecutively provided data and by the number of data pins.

FIG. 1 illustrates the configuration of a general Rambus system. Referring to FIG. 1, a RiMM applied to a Rambus system is formed by disposing several. RDDs on a common PCB at predefined intervals and by sequentially connecting the RDDs using various packaging technologies that include, for example, interconnects in the form of pins or balls. The RDD is thus obtained and operates under the control of command signals that are synchronized to clock signals and that are transferred through a transmission line that is connected to a controller.

FIG. 2 illustrates a RiMM constructed of existing memory. As shown in FIG. 2, a plurality of RDDs are arrayed on bus lines BUS1, BUS2 and BUS3 of a memory system. To connect a first RDD and a connector tab 21 of the PCB for a memory device formed according to existing packaging technology, a bus line BUS3 is directed straight in an upward direction from the tab 21 and then is bent by 90°, and routed to the first RDD; thus requiring a large amount of routing space in an unpopulated portion 20 of the PCB. Similarly, to connect the last RDD to a connector tab of the PCB, routing space is likewise consumed in a distal, unpopulated portion of the PCB. In other words, modules require routing space in unpopulated portions of both ends of the PCB.

FIG. 3 is a photograph of a RiMM device that includes memory devices that are fabricated according to conventional techniques. With reference to FIG. 3, a portion of bus lines 30 is not connected to the RDD due to a lack of space. As described above, even if a smallest size rule is applied to a limited PCB size, it is difficult to design a RiMM product owing to the difficulty in ensuring routing space on both ends of the PCB. Thus, the product device density is lowered. Any required increase in RiMM size negatively impacts the fabrication cost of a computer system.

In a system environment having many mounted RDDs, a transmission line to form a bus line for connecting between an RDD and a tab on both ends of PCB is necessarily wider than that of a transmission line to form a bus line for connecting between mutual RDDs. A wider bus line is required between the devices and tabs for impedance-matching reasons. When a length of the transmission line forming a thick bus line increases, attenuation of a data signal greatly increases.

SUMMARY OF THE INVENTION

The present invention is directed to a system and method of mounting memory devices on a PCB in a manner that reduces signal attenuation.

In one aspect, the present invention is directed to a method of mounting and sequentially connecting at least two memory devices on a printed circuit board (PCB) having an axis of elongation to form a memory module. The method comprises mounting at least one of the memory devices on at least one face of the PCB so that a base line along an longitudinal axis of the at least one memory device lies at an acute angle with respect to the axis of elongation of the PCB.

In one embodiment, the at least one memory device is a Rambus DRAM (Dynamic Random Access Memory) (RDD).

In another embodiment, the at least one memory device comprises multiple memory devices that are mounted to the PCB so that their corresponding base lines lie at angles of about 0°, 45°, 90°, 135° and 180° respectively, relative to the axis of elongation of the PCB.

In another aspect, the present invention is directed to a method of sequentially mounting and connecting memory devices to a PCB having an axis of elongation to form a memory module. The method comprises: mounting a first memory device at a left part of the PCB so that a base line along a longitudinal axis of the first memory device lies at an angle of about 0° with respect to the axis of elongation of the PCB; mounting a second memory device to the right of the first memory device on the PCB so that a base line along a longitudinal axis of the second memory device lies at an angle of about 45° with respect to the axis of elongation of the PCB; mounting one or more third memory devices to the right of the second memory device on the PCB so that a base line along a longitudinal axis of the at least one third memory device lies at an angle of about 90° with respect to the axis of elongation of the PCB; mounting a fourth memory device to the right of the third memory device on the PCB so that base line along a longitudinal axis of the fourth memory device lies at an angle of about 135° with respect to the axis of elongation of the PCB; and mounting a fifth memory device to the right of the fourth memory device on the PCB so that a base line along a longitudinal axis of the fifth memory device lies at an angle of about 180° with respect to the axis of elongation of the PCB.

In one embodiment, the first, second, one or more third, fourth, and fifth memory devices are Rambus DRAM devices.

In another embodiment, the first memory device is mounted nearer to a connector tab of the PCB than the second memory device.

In another embodiment, the first, second, one or more third, fourth, and fifth memory devices are alternately mounted on both faces of the PCB.

In another aspect, the present invention is directed to a method of sequentially mounting and connecting memory devices to a PCB having an axis of elongation to form a memory module. The method comprises: mounting a first memory device at a right part of the PCB so that a base line along a longitudinal axis of the first memory device lies at an angle of about 0° with respect to the axis of elongation of the PCB; mounting a second memory device to the left of the first memory device on the PCB so that a base line along a longitudinal axis of the second memory device lies at an angle of about 45° with respect to the axis of elongation of the PCB; mounting one or more third memory devices to the left of the second memory device on the PCB so that a base line along a longitudinal axis of the at least one third memory device lies at an angle of about 90° with respect to the axis of elongation of the PCB; mounting a fourth memory device to the left of the third memory device on the PCB so that base line along a longitudinal axis of the fourth memory device lies at an angle of about 135° with respect to the axis of elongation of the PCB; and mounting a fifth memory device to the left of the fourth memory device on the PCB so that a base line along a longitudinal axis of the fifth memory device lies at an angle of about 180° with respect to the axis of elongation of the PCB.

In one embodiment, the first, second, one or more third, fourth, and fifth memory devices are Rambus DRAM devices.

In another embodiment, the first memory device is mounted nearer to a connector tab of the PCB than the second memory device.

In another embodiment, the first, second, one or more third, fourth, and fifth memory devices are alternately mounted on both faces of the PCB.

In another aspect, the present invention is directed to a memory module including at least two memory devices that are sequentially connected and mounted on a printed circuit board (PCB) having an axis of elongation. The module includes at least one memory device among the memory devices, which is mounted on at least one face of the PCB so that a base line along a longitudinal axis of the at least one memory device lies at an acute angle with respect the axis of elongation of the PCB.

In one embodiment, the at least one memory device is a Rambus DRAM (Dynamic Random Access Memory) (RDD).

In another embodiment, the at least one memory device comprises multiple memory devices that are mounted to the PCB so that their corresponding base lines lie at angles of about 0°, 45°, 90°, 135° and 180° respectively, relative to the axis of elongation of the PCB.

In another embodiment, the at least one memory devices are alternately mounted on both faces of the PCB.

In another aspect, the present invention is directed to a memory module including memory devices that are sequentially connected and mounted on a PCB having an axis of elongation. The module comprises: a first memory device mounted at a left part of the PCB so that a base line along a longitudinal axis of the first memory device lies at an angle of about 0° with respect to the axis of elongation of the PCB; a second memory device mounted to the right of the first memory device on the PCB so that a base line along a longitudinal axis of the second memory device lies at an angle of about 45° with respect to the axis of elongation of the PCB; one or more third memory devices mounted to the right of the second memory device on the PCB so that a base line along a longitudinal axis of the at least one third memory device lies at an angle of about 90° with respect to the axis of elongation of the PCB; a fourth memory device mounted to the right of the third memory device on the PCB so that base line along a longitudinal axis of the fourth memory device lies at an angle of about 135° with respect to the axis of elongation of the PCB; and a fifth memory device mounted to the right of the fourth memory device on the PCB so that a base line along a longitudinal axis of the fifth memory device lies at an angle of about 180° with respect to the axis of elongation of the PCB.

In one embodiment, the first, second, one or more third, fourth, and fifth memory devices are Rambus DRAM devices.

In another embodiment, the first, second, one or more third, fourth, and fifth memory devices are alternately mounted on both faces of the PCB.

In another aspect, the present invention is directed to a memory module including memory devices that are sequentially connected and mounted on a PCB having an axis of elongation. The module comprises: a first memory device mounted at a right part of the PCB so that a base line along a longitudinal axis of the first memory device lies at an angle of about 0° with respect to the axis of elongation of the PCB; a second memory device mounted to the left of the first memory device on the PCB so that a base line along a longitudinal axis of the second memory device lies at an angle of about 45° with respect to the axis of elongation of the PCB; one or more third memory devices mounted to the left of the second memory device on the PCB so that a base line along a longitudinal axis of the at least one third memory device lies at an angle of about 90° with respect to the axis of elongation of the PCB; a fourth memory device mounted to the left of the third memory device on the PCB so that base line along a longitudinal axis of the fourth memory device lies at an angle of about 135° with respect to the axis of elongation of the PCB; and a fifth memory device mounted to the left of the fourth memory device on the PCB so that a base line along a longitudinal axis of the fifth memory device lies at an angle of about 180° with respect to the axis of elongation of the PCB.

In one embodiment, the first, second, one or more third, fourth, and fifth memory devices are Rambus DRAM devices.

In another embodiment, the first, second, one or more third, fourth, and fifth memory devices are alternately mounted on both faces of the PCB.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS OF THE INVENTION

Hereinafter, exemplary embodiments of the present invention will be described in detail with reference to FIGS. 4 and 5. It will be understood by those skilled in the art that the present invention can be embodied in numerous different forms and is not limited to the following described embodiments. The following various embodiments are exemplary in nature.

Figure 1:
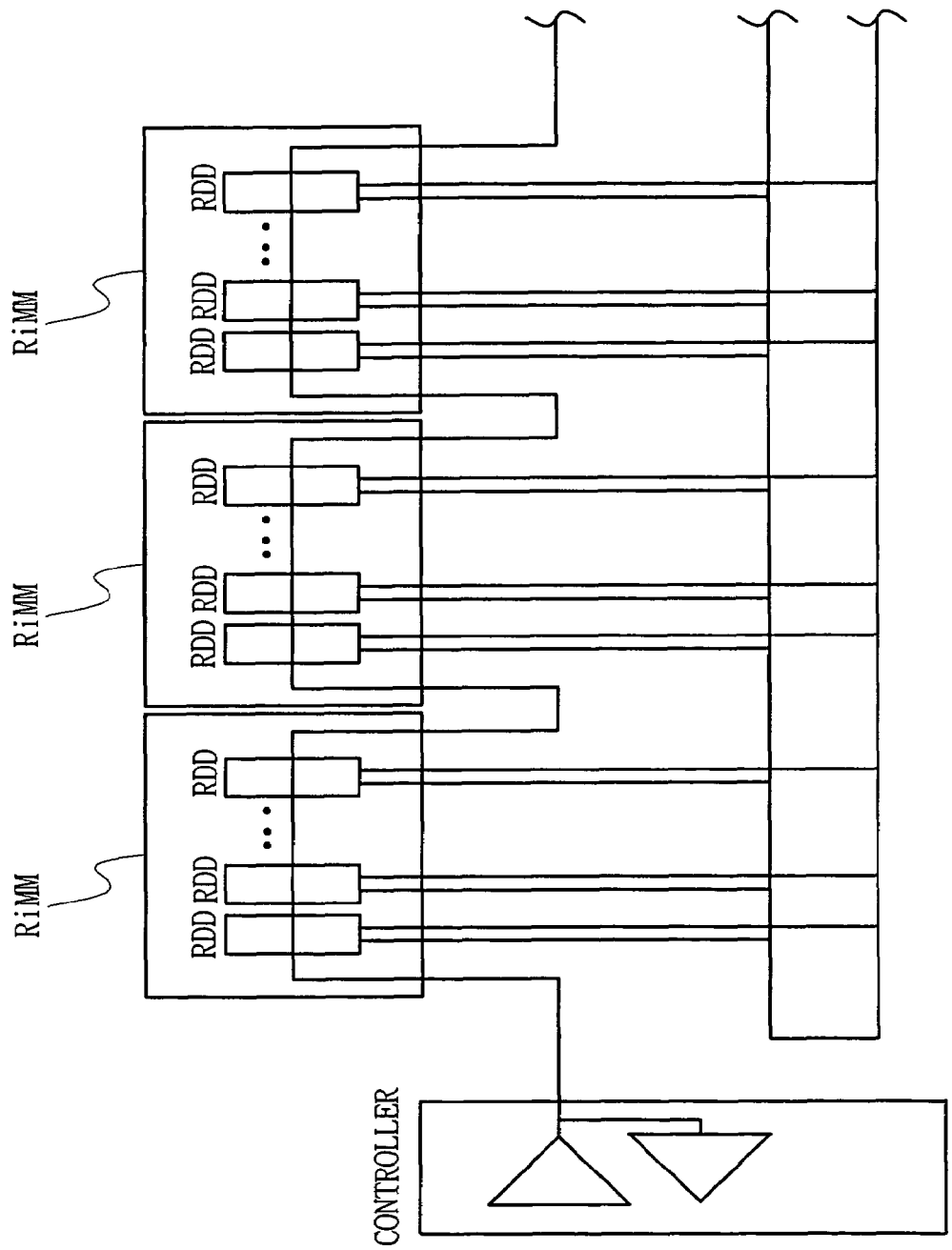
FIG. 1 illustrates a configuration of a conventional Rambus system.
Figure 2:
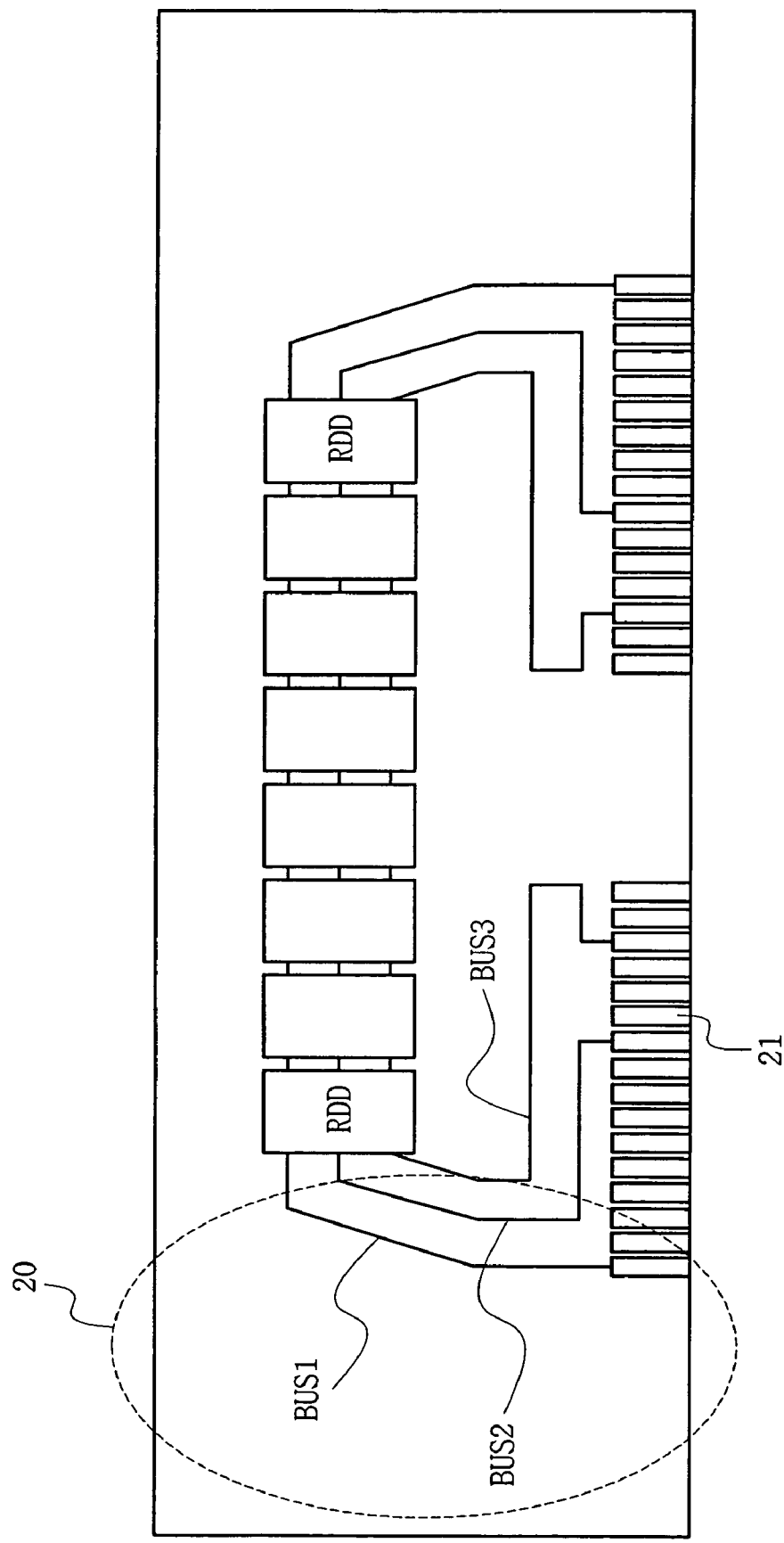
FIG. 2 illustrates a RiMM configured with conventional memory devices according to the conventional architecture.
Figure 3:
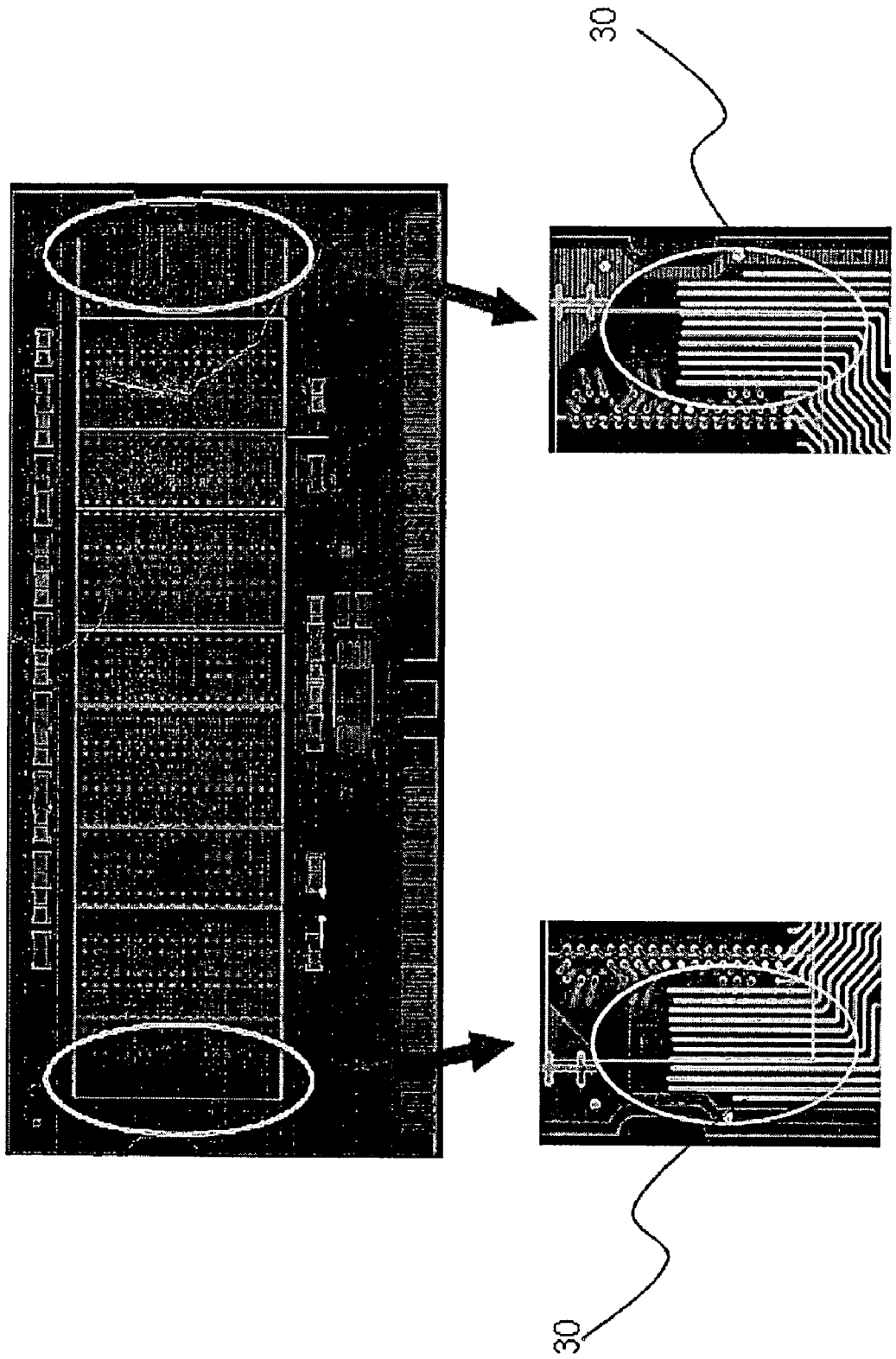
FIG. 3 is a photograph of a conventional RiMM configured with memory devices.
Figure 4:
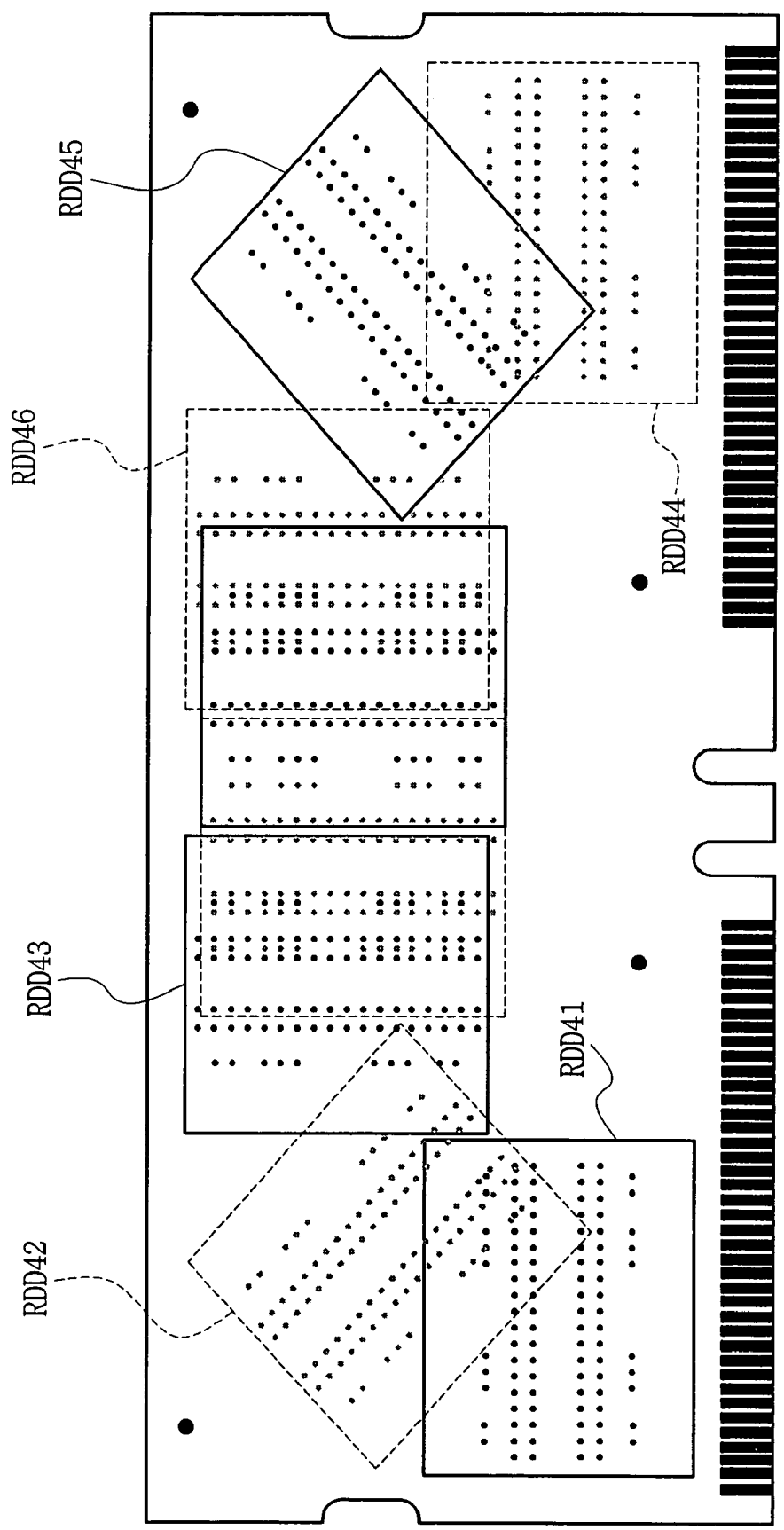
FIG. 4 illustrates a RiMM populated with memory devices using a mounting configuration in accordance with a first exemplary embodiment of the present invention.

FIG. 4 illustrates a RiMM populated with memory devices using a mounting configuration in accordance with a first exemplary embodiment of the present invention, and illustrates eight Rambus DRAMs (RDD) connected and mounted sequentially.

Referring to FIG. 4, RDDs positioned on the left side of the PCB are sequentially connected and mounted on the PCB so that the base lines along the longitudinal axes of the RDDs are respectively angled by about 0°, 45° and 90° with respect to the axis of elongation of the PCB. That is, a base line of a first Rambus DRAM RDD41 positioned first on the left side of the PCB is angled by about 0°, that is, is parallel with the axis of elongation of the PCB (that is, in a direction along an edge of the PCB that includes the connection tabs), and so the RDD is positioned on a front face of the PCB near the PCB connector tabs. Next, a second Rambus DRAM RDD42 is positioned on a back face of the PCB, and a base line thereof is angled by about 45° with respect to the axis of elongation of the PCB. A third Rambus DRAM RDD43 is positioned on a front face of the PCB and a base line thereof is angled by about 90° relative to the axis of elongation of the PCB.

RDDs positioned on the right side of the PCB are sequentially connected and mounted to the PCB, so that base lines of the RDDs are respectively angled by about 90°, 135° and 180° relative to the axis of elongation of the PCB. That is, a fourth Rambus DRAM RDD44 positioned first on the right side is placed close to the connector tabs on the back face of the PCB, in such a way that a base line thereof is angled by about 180° relative to the axis of elongation of the PCB. A fifth Rambus DRAM RDD45 is positioned on a front face of the PCB, and a base line thereof is angled by about 135° relative to the axis of elongation of the PCB. A sixth Rambus DRAM RDD46 is positioned on a back face of the PCB, and a base line thereof is angled by about 90° relative to the axis of elongation of the PCB.

In populating the RDD devices according to the configuration described above, the lengths of bus lines connected between the first RDD RDD41 and tabs positioned at a first end of the PCB can be reduced, and the lengths of bus lines connected between the fourth RDD RDD44 and tabs positioned at a second end of the PCB can be reduced. Thus, attenuation of data signals passing over the bus lines is reduced. Further, in this configuration, a bus line is twice bent by about 45° and connected to an RDD, thus unnecessary routing space on the PCB is reduced, and integration can be increased by reducing unnecessarily occupied PCB area.

Figure 5:
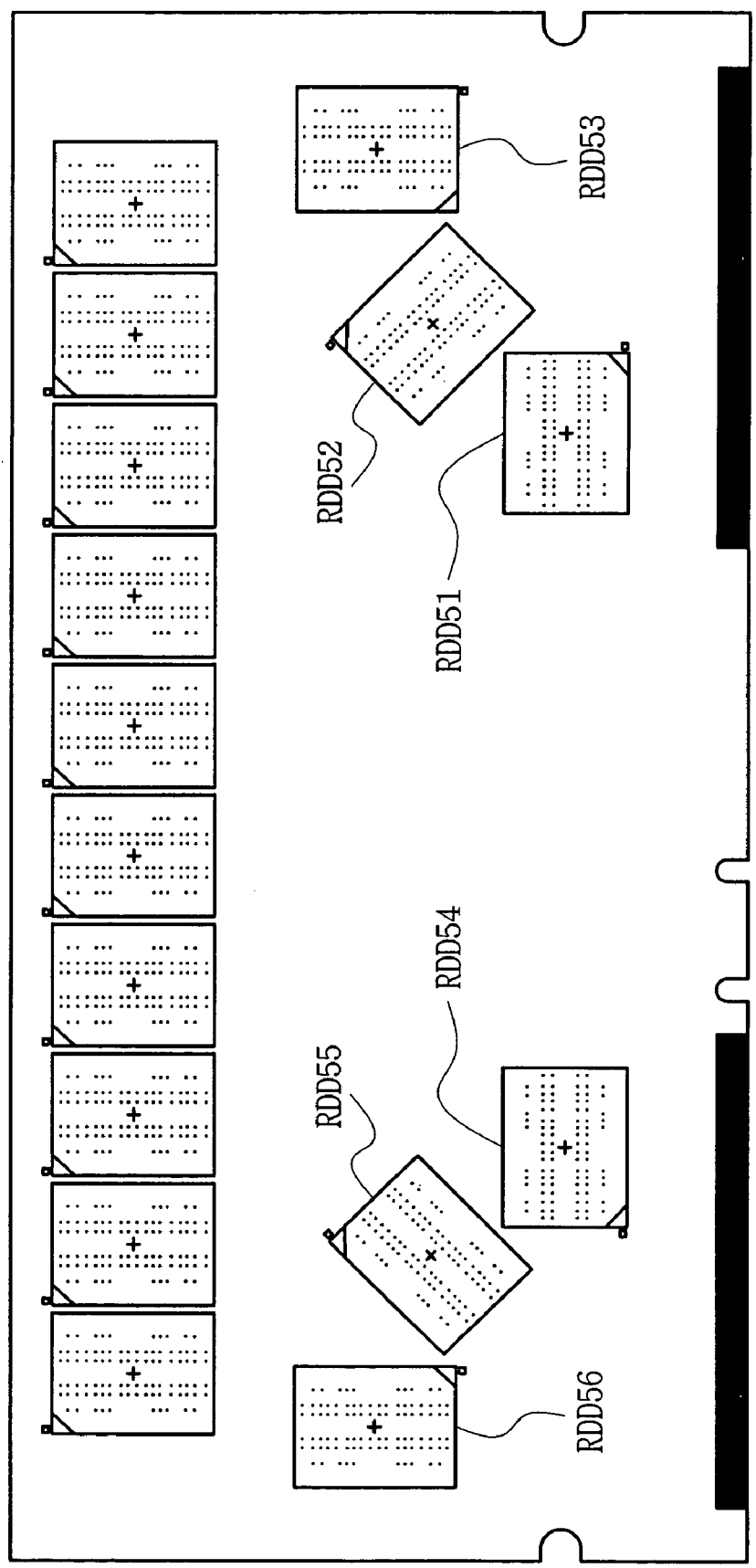
FIG. 5 illustrates a RiMM populated with memory devices using a mounting configuration in accordance with a second exemplary embodiment of the present invention.

FIG. 5 illustrates a RiMM populated with memory devices that are laid out on the PCB according to a fabrication method and configuration in accordance with a second exemplary embodiment of the invention, and depicts 32 RDDs connected and arrayed sequentially.

As shown in FIG. 5, RDDs positioned on the right side of the PCB are sequentially connected and disposed on the PCB so that base lines along the length direction of the RDDs are respectively angled by about 0°, 45° and 90° relative to an axis of elongation of the PCB. That is, a first positioned Rambus DRAM RDD51 is placed near a tab so that a length-directional base line thereof is angled by about 0°, that is, parallel in a length direction to the axis of elongation of the PCB. A next Rambus DRAM RDD52 is positioned so that a base line thereof is angled by about 45° relative to the axis of elongation of the PCB. The next Rambus DRAM RDD53 is positioned so that a base line thereof is angled by about 90° relative to an axis of elongation of the PCB.

Similarly, RDDs positioned on the left side of the PCB are sequentially connected and mounted on the PCB so that length-directional base lines of the RDDs are respectively angled by about 90°, 135° and 180° relative to an axis of elongation of the PCB. That is, a Rambus DRAM RDD54 positioned first on the left side of the PCB is positioned near a tab of the PCB in such a way that a length-directional base line thereof is angled by about 180° relative to the axis of elongation of the PCB. A next Rambus DRAM RDD55 is positioned so that a base line thereof is angled by about 135° relative to the axis of elongation of the PCB. A next Rambus DRAM RDD56 is positioned so that a base line thereof is angled by about 90° relative to the axis of elongation of the PCB. As shown in the drawing, thus, 16 Rambus DRAMs are disposed on a front face of the PCB, and 16 Rambus DRAMs are disposed on a back face of the PCB in similar fashion, that is, the total 32 RDDs are disposed on the RiMM.

Accordingly, according to the RiMM configuration of the present invention, unnecessary routing space is substantially reduced, and a length of bus line connected between a Rambus DRAM on the end of the chain and a connector tab on the PCB is reduced. In this manner, data signal attenuation of signals traversing the bus lines can be reduced.

As described above, in a memory module and a method of mounting a memory device on a PCB to form the memory module according to exemplary embodiments of the invention, unnecessary routing space for bus lines is substantially reduced, and the lengths of the bus lines routed between Rambus DRAMs and connector tabs positioned on edges of a PCB are reduced. In this manner, attenuation of data signals through the bus lines can be reduced.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of mounting and sequentially connecting at least two memory devices on a printed circuit board (PCB) having an axis of elongation to form a memory module, the method comprising:

mounting at least one of the memory devices on at least one face of the PCB so that a base line along a longitudinal axis of the at least one memory device lies at an acute angle with respect to the axis of elongation of the PCB.

2. The method of claim 1, wherein the at least one memory device is a Rambus DRAM (Dynamic Random Access Memory) (RDD).

3. The method of claim 1, wherein the at least one memory device comprises multiple memory devices that are mounted to the PCB so that their corresponding base lines lie at angles of about 0°, 45°, 90°, 135° and 180° respectively, relative to the axis of elongation of the PCB.

4. A method of sequentially mounting and connecting memory devices to a PCB having an axis of elongation to form a memory module, the method comprising:
    mounting a first memory device at a left part of the PCB so that a base line along a longitudinal axis of the first memory device lies at an angle of about 0° with respect to the axis of elongation of the PCB;
    mounting a second memory device to the right of the first memory device on the PCB so that a base line along a longitudinal axis of the second memory device lies at an angle of about 45° with respect to the axis of elongation of the PCB;
    mounting one or more third memory devices to the right of the second memory device on the PCB so that a base line along a longitudinal axis of the at least one third memory device lies at an angle of about 90° with respect to the axis of elongation of the PCB;
    mounting a fourth memory device to the right of the third memory device on the PCB so that base line along a longitudinal axis of the fourth memory device lies at an angle of about 135° with respect to the axis of elongation of the PCB; and
    mounting a fifth memory device to the right of the fourth memory device on the PCB so that a base line along a longitudinal axis of the fifth memory device lies at an angle of about 180° with respect to the axis of elongation of the PCB.

5. The method of claim 4, wherein the first, second, one or more third, fourth, and fifth memory devices are Rambus DRAM devices.

6. The method of claim 4, wherein the first memory device is mounted nearer to a connector tab of the PCB than the second memory device.

7. The method of claim 4, wherein the first, second, one or more third, fourth, and fifth memory devices are alternately mounted on both faces of the PCB.

8. A method of sequentially mounting and connecting memory devices to a PCB having an axis of elongation to form a memory module, the method comprising:
    mounting a first memory device at a right part of the PCB so that a base line along a longitudinal axis of the first memory device lies at an angle of about 0° with respect to the axis of elongation of the PCB;
    mounting a second memory device to the left of the first memory device on the PCB so that a base line along a longitudinal axis of the second memory device lies at an angle of about 45° with respect to the axis of elongation of the PCB;
    mounting one or more third memory devices to the left of the second memory device on the PCB so that a base line along a longitudinal axis of the at least one third memory device lies at an angle of about 90° with respect to the axis of elongation of the PCB;
    mounting a fourth memory device to the left of the third memory device on the PCB so that base line along a longitudinal axis of the fourth memory device lies at an angle of about 135° with respect to the axis of elongation of the PCB; and
    mounting a fifth memory device to the left of the fourth memory device on the PCB so that a base line along a longitudinal axis of the fifth memory device lies at an angle of about 180° with respect to the axis of elongation of the PCB.

9. The method of claim 8, wherein the first, second, one or more third, fourth, and fifth memory devices are Rambus DRAM devices.

10. The method of claim 8, wherein the first memory device is mounted nearer to a connector tab of the PCB than the second memory device.

11. The method of claim 8, wherein the first, second, one or more third, fourth, and fifth memory devices are alternately mounted on both faces of the PCB.

12. A memory module including at least two memory devices that are sequentially connected and mounted on a printed circuit board (PCB) having an axis of elongation, the module comprising:
    at least one memory device among the memory devices, which is mounted on at least one face of the PCB so that a base line along a longitudinal axis of the at least one memory device lies at an acute angle with respect the axis of elongation of the PCB.

13. The module of claim 12, wherein the at least one memory device is a Rambus DRAM (Dynamic Random Access Memory) (RDD).

14. The module of claim 12, wherein the at least one memory device comprises multiple memory devices that are mounted to the PCB so that their corresponding base lines lie at angles of about 0°, 45°, 90°, 135° and 180° respectively, relative to the axis of elongation of the PCB.

15. The module of claim 12, wherein the at least one memory devices are alternately mounted on both faces of the PCB.

16. A memory module including memory devices that are sequentially connected and mounted on a PCB having an axis of elongation, the module comprising:
    a first memory device mounted at a left part of the PCB so that a base line along a longitudinal axis of the first memory device lies at an angle of about 0° with respect to the axis of elongation of the PCB;
    a second memory device mounted to the right of the first memory device on the PCB so that a base line along a longitudinal axis of the second memory device lies at an angle of about 45° with respect to the axis of elongation of the PCB;
    one or more third memory devices mounted to the right of the second memory device on the PCB so that a base line along a longitudinal axis of the at least one third memory device lies at an angle of about 90° with respect to the axis of elongation of the PCB;
    a fourth memory device mounted to the right of the third memory device on the PCB so that base line along a longitudinal axis of the fourth memory device lies at an angle of about 135° with respect to the axis of elongation of the PCB; and
    a fifth memory device mounted to the right of the fourth memory device on the PCB so that a base line along a longitudinal axis of the fifth memory device lies at an angle of about 180° with respect to the axis of elongation of the PCB.

17. The module of claim 16, wherein the first, second, one or more third, fourth, and fifth memory devices are Rambus DRAM devices.

18. The module of claim 16, wherein the first, second, one or more third, fourth, and fifth memory devices are alternately mounted on both faces of the PCB.

19. A memory module including memory devices that are sequentially connected and mounted on a PCB having an axis of elongation, the module comprising:
   a first memory device mounted at a right part of the PCB so that a base line along a longitudinal axis of the first memory device lies at an angle of about 0° with respect to the axis of elongation of the PCB;
   a second memory device mounted to the left of the first memory device on the PCB so that a base line along a longitudinal axis of the second memory device lies at an angle of about 45° with respect to the axis of elongation of the PCB;
   one or more third memory devices mounted to the left of the second memory device on the PCB so that a base line along a longitudinal axis of the at least one third memory device lies at an angle of about 90° with respect to the axis of elongation of the PCB;
   a fourth memory device mounted to the left of the third memory device on the PCB so that base line along a longitudinal axis of the fourth memory device lies at an angle of about 135° with respect to the axis of elongation of the PCB; and
   a fifth memory device mounted to the left of the fourth memory device on the PCB so that a base line along a longitudinal axis of the fifth memory device lies at an angle of about 180° with respect to the axis of elongation of the PCB.

20. The module of claim 19, wherein the first, second, one or more third, fourth, and fifth memory devices are Rambus DRAM devices.

21. The module of claim 19, wherein the first, second, one or more third, fourth, and fifth memory devices are alternately mounted on both faces of the PCB.

* * * * *

UNITED STATES PATENT AND TRADEMARK OFFICE
CERTIFICATE OF CORRECTION

PATENT NO. : 7,348,219 B2  Page 1 of 1
APPLICATION NO. : 11/301142
DATED : March 25, 2008
INVENTOR(S) : Do-Hyung Kim et al.

It is certified that error appears in the above-identified patent and that said Letters Patent is hereby corrected as shown below:

In the title of the patent item (54); delete "Method of Mounting Memory Device on PCB for Memory Module" and insert --Memory Module and Method of Mounting Memory Device on PCB for Memory Module--

Signed and Sealed this

Twenty-eighth Day of October, 2008

JON W. DUDAS
*Director of the United States Patent and Trademark Office*